United States Patent [19]

Potember et al.

[11] Patent Number: 4,652,894

[45] Date of Patent: * Mar. 24, 1987

[54] ELECTRICAL ORGANIC THIN FILM SWITCHING DEVICE SWITCHING BETWEEN DETECTABLY DIFFERENT OXIDATION STATES

[75] Inventors: Richard S. Potember, Catonsville; Theodore O. Poehler, Jr., Baltimore; Dwaine O. Cowan, Towson, all of Md.

[73] Assignee: The Johns Hopkins University, Baltimore, Md.

[*] Notice: The portion of the term of this patent subsequent to Feb. 1, 2000 has been disclaimed.

[21] Appl. No.: 691,600

[22] Filed: Jan. 15, 1985

Related U.S. Application Data

[62] Division of Ser. No. 385,523, Jun. 7, 1982, Pat. No. 4,507,672, which is a division of Ser. No. 130,400, Mar. 14, 1980, Pat. No. 4,371,883.

[51] Int. Cl.<sup>4</sup> ............................................. H01L 29/28
[52] U.S. Cl. .................................. 357/8; 252/62.3 Q; 357/1; 357/2
[58] Field of Search .............. 252/62.3 Q; 260/396 N, 260/396 R; 357/8

[56] References Cited

U.S. PATENT DOCUMENTS

| | | | |
|---|---|---|---|
| 3,162,641 | 12/1964 | Acker et al. | 252/62.3 Q |
| 3,229,469 | 1/1966 | Katon | 252/62.3 Q |
| 3,255,392 | 6/1966 | Wahlig | 252/62.3 Q |
| 3,687,987 | 8/1972 | Martin | 260/396 N |

OTHER PUBLICATIONS

Kamitsos et al, Solid State Communications, vol. 45, No. 2, 1983, pp. 165–169.
Melby et al, J. American Chemistry, vol. 84, pp. 3374–3387, 1962.
Kevorkian et al, Discussions of Faraday Society, No. 51, 1971, pp. 139–142.

Primary Examiner—William D. Larkins
Attorney, Agent, or Firm—Robert E. Archibald; Howard W. Califano; Mary Louise Beall

[57] ABSTRACT

A current-controlled, bistable threshold or memory switch comprises a polycrystalline metal-organic semiconductor sandwiched between netallic electrodes. Films of either copper or silver complexed with TNAP, DDQ, TCNE, TCNQ, derivative TCNQ molecules, or other such electron acceptors provide switching between high and low impedance states with combined delay and switching times on the order of 1 nanosecond. Switching behavior of a complex of the present invention is related to the reduction potential of the acceptor molecule.

30 Claims, 5 Drawing Figures

ELECTRICAL ORGANIC THIN FILM SWITCHING DEVICE SWITCHING BETWEEN DETECTABLY DIFFERENT OXIDATION STATES

STATEMENT OF GOVERNMENTAL INTEREST

The invention herein described was made in the course of or under a contract or subcontract thereunder with the Department of the Navy. The Government also has rights in the invention pursuant to Grant No. DMR-76-84238 awarded by the National Science Foundation.

RELATED APPLICATIONS

This is a division of Ser. No. 385,523 filed June 7, 1982, now U.S. Pat. No. 4,507,672, which was a division of Ser. No. 130,400 filed Mar. 14, 1980, now U.S. Pat. No. 4,371,883.

TECHNOLOGICAL CONTEXT OF THE INVENTION

In the field of electrical switching, the use of organic thin films has been suggested by the prior and current art. Elsharkawi, A. R. and Kao, K. C. "Switching and Memory Phenomena in Anthracene Thin Films", *Phys. Chem. Soc.* 1977, Vol. 18, pp. 95–96; Stafeev, V. I., Kuznetsova, V. V., Molchanov, V. P., Serov, S. S., Pospelov, V. V., Karakushan, E. I., Airapetyants, S. V., and Gasanov, L. S. "Negative Resistance of Very Thin Organic Films Between Metal Electrodes", *Soviet Physics Semiconductors*, Volume 2, No. 5, November 1965, pp. 642–643; Carchano, H., Lacoste, R., and Segui, Y., "Bistable Electrical Switching in Polymer Thin Films", *Applied Physics Letters*, Volume 19, Number 10, 15 Nov. 1971, pp. 414–415; Kevorkian, J., Labes, M. M., Larson, D. C. and Wu, D. C. "Bistable Switching in Organic Thin Films", *Discussions of The Faraday Society*, No. 51, 1971; and Szymanski, A., Larson, D. C. and Labes, M. M. "A Temperature-Independent Conducting State in Tetracene Thin Film", *Applied Physics Letters*, Volume 14, Number 3, 1969, pp. 88–90 disclose various organic thin film switches. Elsharkawi et al teach an antracene switch; Stafeev et al teach a cholesterol switch; and Kevorkian et al, as well as Syzmanski et al, teach "reproducible bistable switching in aromatic hydrocarbon thin films, such as tetracene and perylene." The mechanisms of switching in these organic elements are basically physical in nature. Impedance changes which accompany switching are associated with molecular motion due to Joule heating which results in either crystallization phase transitions, metal filament formation, or elimination of compositional disorder. Switching has also been related to electrical breakdown due to weak spots in the switching material. Switching by means of electrochemical changes is not suggested by the references. More particularly, switching due to electrochemical changes in a metal complexed with tetracyanoquinodimethane (TCNQ), tetracyanonaphthoquinodimethane (TNAP), tetracyanoethylene (TCNE), dichlororicyanobenzoquinone (DDQ), or TCNQ derivatives is not contemplated. The electrical characteristics of devices discussed in the above references may be erratic in nature or not readily reproducible. Further, these references disclose switching at impractical voltage or current levels and do not mention high-speed, nanosecond switching. Organic devices in general have not been shown to be comparable to other inorganic switches currently in use.

Such inorganic devices include switches such as those amorphous alloy switches discussed in U.S. Pat. Nos. 3,530,441, 3,588,638, 3,644,741, 3,715,634, 3,868,651, 3,983,542, and 3,988,720 (by Ovshinsky et al). Amorphous alloys, including chalcogenide glasses, are inorganic semiconductors which show switching behavior. These glasses contain up to four elements, often including arsenic and/or tellurium, and exhibit a current-controlled negative resistance. One such amorphous alloy is

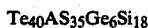

$Te_{40}As_{35}Ge_6Si_{18}$

Other inorganic switching materials include the oxides of nickel, silicon, aluminum, titanium, zirconium, and tantalum, all of which exhibit a voltge-controlled negative resistance when arranged in a metal-oxide-metal sandwich structure. Switching behavior in these inorganic materials has been attributed to the forming of filaments which are described by both thermal and electronic models. The electrical behavior of these materials has generally been found to be unstable, not reproducible, and not independent of polarity of applied switching signal. Examining only inorganic materials, the above-discussed references do not even consider the possibility of switching with an organic film of metal complexed with TCNQ, TNAP, TCNE, DDQ, or TCNQ derivatives.

The employment of TCNQ in a switching device has been suggested. However the phenomena employed are unrelated to electrochemical variations in the switching material and the materials used are not of a thin film semiconductor nature. Devices by Aviram (U.S. Pat. Nos. 3,833,894 and 3,953,874) exploit the tunnelling phenomenon in an organic memory comprising a compound (which may include TCNQ) sandwiched between base metal layers. The I-V characteristics of the Aviram devices do not show negative resistance and are not discontinuous at a given threshold. Also the role of TCNQ in the Aviram devices is not particularly significant. The switching relates to non-conjugate bridges interposed between two redox couple elements which, when sufficient potential is applied to overcome a potential well caused by the bridge, interchange structure due to electron tunnelling. Remaining elements, one of which can be TCNQ (acting as a simple anion), are included to maintain electro-neutrality when the two elements interchange configurations. This tunnelling effect works equally well with various anions other than TCNQ, the TCNQ not being essential to the tunnelling. Another patent by Biernat (U.S. Pat. No. 3,119,099) cited in Aviram, Considers changes in molecular structure which effect bistable switching. The molecular storage unit in the Biernat patent is described electronically with reference to molecular distortion resulting in changed energy states.

An article by L. R. Melby, R. J. Harder, W. R. Hertler, W. Mahler, R. E. Benson, and W. E. Mochel entitled "Substituted Quinodimethans. II. Anionradical Derivatives and Complexes of 7,7,8,8 Tetracyanodiquinomethane,"*Journal of American Chemistry*, vol. 84, pp. 3374–3387, 1962, describes a method of making cuprous and other metallic salts of TCNQ. No suggestion is made that any of the salts might exist physically as a film or electrically as a semiconductor or switch.

U.S. Pat. No. 3,331,062 (by Wisdom and Forster) considers the use of a metal electrode immersed in an electron acceptor such as tetracyanoethylene (TCNE). The patent discusses the storage of information by means of an electrochemical device, however it is limited to elements in liquid solution form. The basis for such a device is the change in capacitance realized when a pulse is applied to a memory cell comprised of an electrode and a liquid acceptor. While useful, the device of U.S. Pat. No. 3,331,062 is not solid-state and requires the combining of the acceptor with a non-metal donor to form a liquid. High-speed threshold and memory switching by changing resistance states are not detailed. Combining the teachings of organic and inorganic switching technology, U.S. Pat. No. 3,719,933 (by Wakabayashi, Kinugasa, Hozumi, and Sugihara) discloses the dispersing of inorganic lead oxide in an organic resin film to achieve a memory device having both a high and a low resistance state.

SUMMARY OF THE INVENTION

In the context of the aforementioned prior and contemporaneous switching devices, the present invention is novel and significant by providing a method of fabricating an organic thin film, solid-state semi-conductor, current-controlled switch comprised of copper or silver complexed with TCNE, TCNQ, a TCNQ derivative, DDQ, or TNAP. Specifically, the present invention produces a switch responsive to electrochemical changes in the thin film semiconductor.

It is a purpose of the invention to provide a method of fabricating an organic thin film device exhibiting switching from a high impedance state to a low impedance state by applying an electric field of any polarity. The magnitude of the applied field required to effect switching depends on the strength of the electron acceptor. In accordance with the invention, switching back to the high impedance state can be achieved by introducing a pulse of polarity opposite that of the previously applied electric field where the electron acceptor is of relatively intermediate strength.

It is another purpose of the invention to provide a method of fabricating an organic thin film device exhibiting reliable, high-speed, reproducible switching in a threshold or memory mode. Whether the device operates in the threshold or memory mode depends on the redox potential of the electron acceptor which is complexed with the copper or silver and the length and duration of the field applied to generate switching.

The device may, alternatively, operate as a diode if connected to an electrode of a selected material, such as platinum, gold or magnesium.

It is yet another purpose of the present invention to provide a method of fabricating an organic, solid-state semiconductor device which switches in response a low voltage (e.g. 3 to 12 volts). In the "ON" state, the device will not break down with currents applied in excess of 30 milliamperes. These parameters render the present invention practical for conventional electronic switching applications.

It is a particularly significant purpose of the present invention to provide a method of fabricating an organic element which switches between impedance states in the nanosecond range.

It is a further purpose of the invention to provide a method of fabricating an organic, solid state semiconductor switch which is, but is not necessarily limited to being, insensitive to moisture, radiation, and temperature. The present switching device is stable at temperatures between −50° C. and 150° C.

It is still a further purpose of the invention to provide a method of fabricating a two-terminal device which can be adapted to a three-terminal or other multiterminal switching device or matrix. It is yet a further purpose to provide an organic switching device fabricated according to a process whereby a metal is complexed with TCNE, TCNQ, a TCNQ derivative, or TNAP to form a film. The thickness of the film, generally on the order of 1 to 10 μm, can be carefully controlled.

It is an ancillary purpose of the invention to provide a method of fabricating a device which acts as an organic, electrochemical storage cell when passing from a low to a high impedance state.

It is still a particularly significant purpose of the invention to fabricate a thin film to effect switching by means of a field induced redox reaction in a film comprised of copper (or silver) and TCNQ (TCNE, DDQ, TNAP, or a TCNQ derivative) wherein mixed valence species (i.e. complex salts) are in equilibrium with a simple 1:1 salt. In accordance with the invention, switching is described by the process equation:

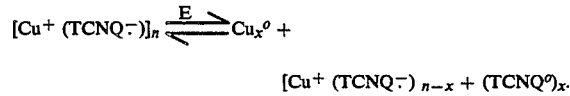

$$[Cu^+ (TCNQ^-)]_n \xrightleftharpoons{E} Cu_x^o +$$

$$[Cu^+ (TCNQ^-)]_{n-x} + (TCNQ^o)_x.$$

DESCRIPTION OF THE INVENTION

Figure 1:
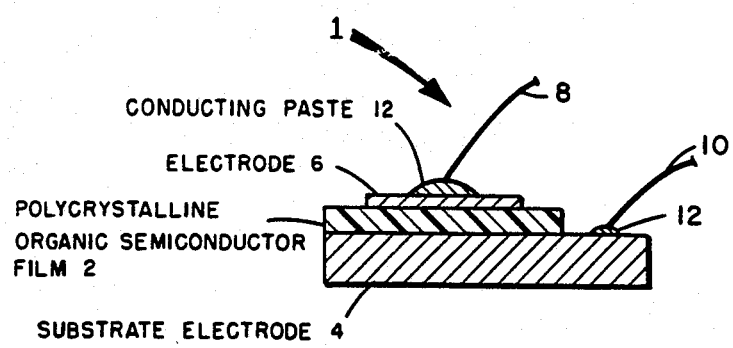
FIG. 1 shows an embodiment of the invention.

One embodiment of the present invention is shown in FIG. 1 a 1–10 μm thick polycrystalline film 2 of a copper or silver charge-transfer complex is sandwiched between two metal electrodes 4 and 6. One electrode 4 comprises a metallic substrate which may be made of the metal found in the charge-transfer complex. The other, a top electrode 6, may be selected from various metals, such as aluminum, platinum, gold, magnesium, or chromium. The selection of the top electrode 6, however, may affect the nature of the device 1 shown in FIG. 1.

With the top electrode 6 being either aluminum or chromium, the device 1 acts as a switch. Depending on various characteristics (to be discussed later) of the film 2, the device 1 will act as either a threshold switch or a memory switch. However, selecting a top electrode 6 of another metal, such as platinum, gold, or magnesium, can alter the nature of the device 1 to function as a diode.

As a threshold switch or memory switch, the device 1 in FIG. 1 is a two-terminal device which is stable in either a high or low impedance state. The transition from the high to the low impedance state occurs when an electric field which exceeds a threshold level is applied across the film 2. The field can be easily generated by providing a voltage, with any of various known means, across the two electrodes 4 and 6 through external contact wires 8 and 10, respectively. The upper contact wire 8 is shown connected to the top electrode 6 by a conducting paste (such as silver) or by liquid metals of mercury, gallium, or gallium-indium utectic 12. As a memory switch, the device 1 remains in the low impedance state after the initial applied field (which exceeds the threshold) is removed. As a threshold switch, the device 1 immediately returns to the high impedance state when the applied field falls below a minimum holding value which, for the present invention, is somewhat below the threshold value.

Figure 2:
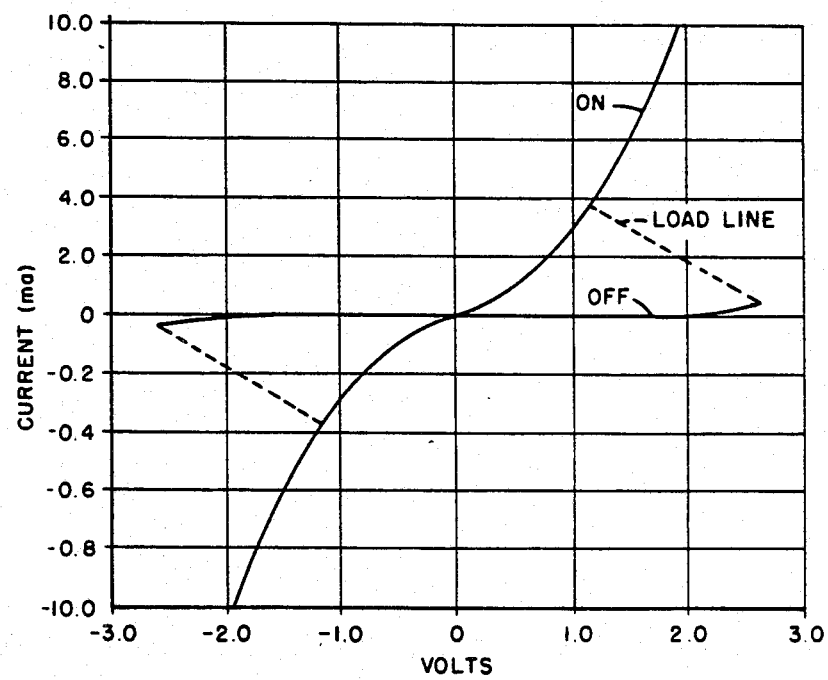
FIG. 2 shows the I-V characteristics.

The behavior of the device 1 as a memory switch or threshold switch is illustrated in FIG. 2. The device 1 displays an S-shaped, negative resistance I–V characteristic, for a 3.75 μm thick Cu/CuTNAP/Al film 2 of a sample device, measured across a 100 ohm resistor. The "OFF", or high impedance, state is shown having small current variations for voltages ranging (in the FIG. 2 sample embodiment) up to 2.7 volts. At the 2.7 volt threshold, the device 1 assumes an "ON", or low, impedance state. Because the I–V characteristic of the device 1 is symmetric about the origin, similar switching occurs regardless of voltage polarity. As indicated by the dashed load line, the device 1 remains in the "ON" state after the threshold (2.7 volts or −2.7 volts in the sample embodiment) is exceeded even when the voltage thereafter drops below the threshold. In the case of the threshold switch, the device 1 returns to the "OFF" state when the field falls below the holding value. For the memory switch, the device 1 remains in the "ON" state indefinitely in the presence of an electric field and decays to an "OFF" state over time if the field is removed. The time required to return to the initial state appears to be directly proportional to the film thickness, the duration of the applied field, and the amount of power dissipated in the film 2 while in the "ON" state.

An interesting characteristic of the present device 1 is that it generates a small electromotive force (emf) when it returns to the "OFF" state from the "ON" STATE. In this respect, the device 1 acts as a small electrochemical storage cell.

In the sample embodiment of FIG. 2, the threshold field is approximately $8.1 \times 10^3$ V/cm and the high impedance state corresponds to $1.25 \times 10^4$ ohms compared with 190 ohms for the low impedance state. The time required to switch back to the initial state appears to be directly proportional to the film thickness, the duration of the applied field, and the amount of power dissipated in the film 2 while in the ON state.

Figure 3:
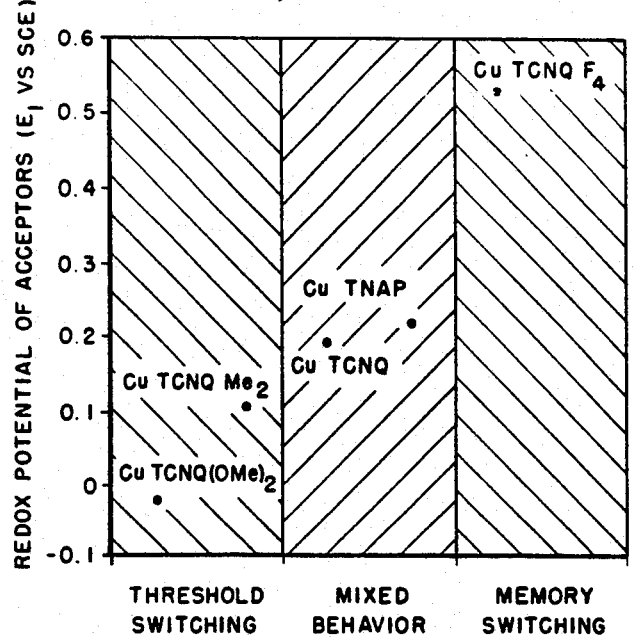
FIG. 3 illustrates behavior of different compositions.

The low impedance state of films comprising copper and silver complexes according to the present invention is also related to the acceptor molecule complexed with the copper or silver. For example, copper salts consistently exhibit greater stability and reproducibility over the corresponding silver salts of the same acceptor. Also, preferred switching behavior of the different complexes is related to the reduction potential of the various acceptors. This is shown in FIG. 3 using copper as a donor in each case. For devices made from weak electron acceptors like CuTCNQ(OMe)$_2$, the switching behavior is usually of the threshold type. That is, when the applied voltage is removed from the device 1 which is in the "ON" state, the device 1 will immediately return to the "OFF" state. On the other hand, for strong electron acceptors, like CuTCNQF$_4$, a memory effect is observed. This memory state remains intact from a few minutes up to several days and cannot be removed by the application of a short pulse of current. For intermediate strength acceptors, however, the device can operate as either a memory switch or a threshold switch by varying the strength or the duration of the applied field in the low impedance state. When the device 1 comprises an intermediate acceptor, such as TCNQ or TNAP, a return to the "OFF" state can be achieved by introducing a short high density current pulse of either polarity.

The required field strength for switching parallels the strength of the acceptor. The copper salt of TCNQ(OMe)$_2$ switches at a field strength of approximately $2 \times 10^3$ V/cm, while the copper salt of TCNQF$_4$ is found to switch at a field strength of about $1 \times 10^4$ V/cm. These effects, shown in FIG. 3, indicate that switching behavior is related to the reduction potential of the acceptor. In the family of TCNQ derivatives which include, but are not limited to the following:

TCNQ(OMe)
TCNQ(OMe)$_2$
TCNQ(OMe)(OEt)
TCNQ(OMe)(O-i-Bu)
TCNQ(CN)$_2$
TCNQ(OMe)(O-i-C$_2$H$_5$)
TCNQ(OEt)(SMe)
TCMQCl
TCNQBr
TCNQClMe
TCNQBrMe
TCNQIMe
TCNQCl
TCNQBr
TCNQI
TCNQ(OMe)(OCH$_3$)$_2$
TCNQ(Me)
TCNQ(Et)
TCNQ(i-Pr)$_2$
TCNQ(i-Pr)

the nature of switching for any given acceptor will be defined as a function of its reduction potential.

Figure 4:
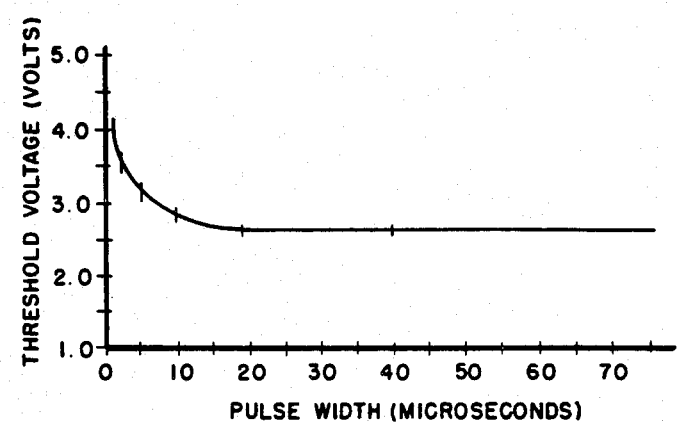
FIGS. 4–5 show time dependence of switching.

In addition to reduction potential, switching characteristics are also affected by the magnitude and duration of a switching pulse applied to the device 1. In FIG. 4, the dependence of threshold voltage on pulse duration for an embodiment having a microcrystalline film 2 of copper tetracyanonaphthoquinodimethane (Cu-TNAP) is shown. For a long pulses, the threshold voltage is identical to that shown in the dc characteristic of FIG. 2. As the pulse length is decreased the threshold voltage increases sharply for pulses of 1–5 μsec duration. For pulses of nanosecond duration, switching still occurs, however, the value of the required threshold voltage is increased slightly and is less consistent than at longer pulse durations.

Figure 5:
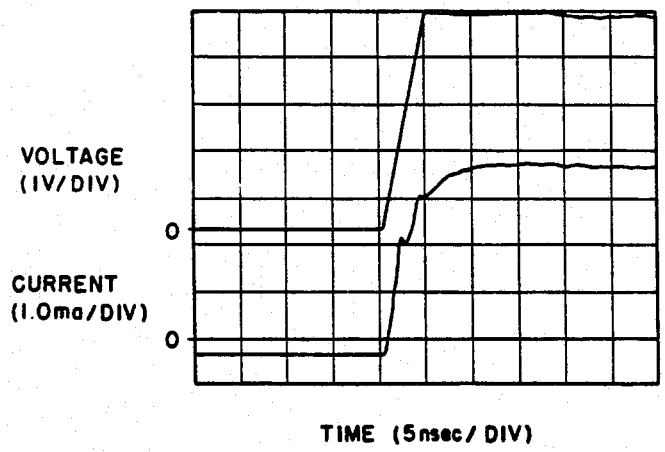

The transient response of the Cu-TNAP embodiment, to a "rectangular" pulse havng a 4 nsec rise time, is shown in FIG. 5. The voltage pulse (shown in the upper portion of the trace) causes the device 1 to switch from the high to the low impedance state. The trace in FIG. 5 is particularly significant, indicating that the mechanism of switching in the present invention is not of a thermal nature. The mechanism instead appears to be the result of a field induced solid-state reversible electrochemical reaction particularly associated with the metal charge-transfer salts:

| CuTCNQ(OMe) | CuTCNQCl | AgTCNQ(OMe) | AgTCNQCl |

| -continued | | | |
|---|---|---|---|
| CuTCNQ(OMe)$_2$ | CuTCNQBr | AgTCNQ(OMe)$_2$ | AgTCNQBr |
| CuTCNQ(OMe)(OEt) | CuTCNQI | AgTCNQ(OMe)(OEt) | AgTCNQI |
| CuTCNQ(OMe)(O—I-Pr) | CuTCNQ(OMe)(OCH$_3$)$_2$ | AgTCNQ(OMe)(O—I-Pr) | AgTCNQ(OMe)(OCH$_3$)$_2$ |
| CuTCNQ(OMe)(O—i-Bu) | CuTCNQ(CN)$_2$ | AgTCNQ(OMe)(O—i-Bu) | AgTCNQ(CN)$_2$ |
| CuTCNQ(O—i-C$_2$H$_5$) | CuTCNQ(Me) | AgTCNQ(O—i-C$_2$H$_5$) | AgTCNQ(Me) |
| CuTCNQ(OEt)(SMe) | CuTCNQ(Et) | AgTCNQ(OEt)(SMe) | AgTCNQ(Et) |
| CuTCNQCl | CuTCNQ(i-Pr) | AgTCNQCl | AgTCNQ(i-Pr) |
| CuTCNQBr | CuTCNQ(i-Pr)$_2$ | AgTCNQBr | AgTCNQ(i-Pr)$_2$ |
| CuTCNQClMe | CuTNAP | AgTCNQClMe | AgTNAP |
| CuTCNQBrMe | CuTCNE | AgTCNQBrMe | AgTCNE |
| CuTCNQIMe | CuDDQ | AgTCNQIMe | AgDDQ |

Fabrication of the device consists of first removing any oxide layers and organic contaminants from either a piece of copper or silver metal. The cleaned metal is then placed in a solution of dry and degassed acetonitrile which has been saturated with a neutral acceptor molecule, for example, TCNQ. Alternatively, the metal can be immersed in methanol or any other solution which dissolves the acceptor molecule. The neutral acceptors used are preferably recrystallized twice from acetonitrile and then sublimed preferably under a high vacuum prior to their use. When the solution saturated with the neutral acceptor is brought in contact with a metal substrate of either copper or silver, a rapid oxidation-reduction reaction occurs in which the corresponding metal salt of the ion-radical acceptor molecule is formed. The basic reaction is shown in Equation 1 for copper and TCNQ.

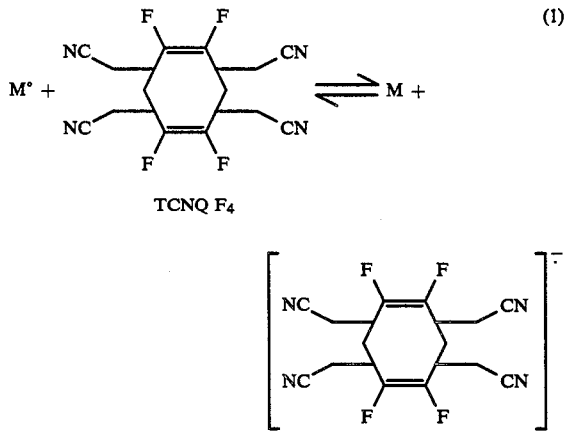

TCNQ F$_4$

The direct oxidation-reduction reaciton results in the forming of a highly microcrystalline film 2 directly on the copper or silver. The film 2, grown according to this technique, shows a metallic sheen and can be grown to a thickness of 10 μm in a matter of minutes. The thickness may, of course, vary depending on application. The thicker the film 2, the longer the memory state lasts when the applied field is removed.

Once the polycrystalline film has been grown to the desired thickness, the growth process can be terminated by simply removing the metal substrate containing the organic layer film 2 from the acetonitrile solution. This terminates the redox reaction. The two component structure, comprising the film 2 and the substrate electrode 4, is gently washed with additional acetonitrile to remove any excess neutral acceptor molecules and is then dried under a vacuum to remove any traces of acetonitrile solvent. Elemental analysis performed on the bulk of the polycrystalline films of Cu-TCNQ and Cu-TNAP in the "OFF" state reveals that the metal/acceptor ratio is 1:1 in both salts. A three component structure is complete when a top metal electrode 6 of either aluminum or chromium is pressure contacted, evaporated, or sputtered directly on the organic film 2.

It is believed that the solid-state, reversible electrochemical redox reaction which results in switching in the present invention produces mixed valence species or complex salts. The salts can exist in solid-state equilibrium with the simple 1:1 salt as exemplified by the equation:

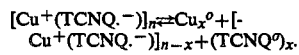

An ionic or a molecular displacement associated with this equiplibrium apparently explains the observed memory phenomena and the fact that switching, according to the present invention, is between only two stable resistive states.

Although the present invention has been described in detail with regard to copper complexed with TCNQ (and certain derivatives thereof) and TNAP, the present switching device 1 may also include films 2 of other compositions (such as those listed above) and copper or silver complexed with 2,3 dichloro 5,6 dicyano 1,4 benzoquinone (DDQ) which act subject to the same phenomena and are within the redox potential spectrum discussed above. Of particular significance, the switching behavior and fabrication of the electron acceptor tetracyanoethylene (TCNE) is similar to that of the above discussed TNAP, TCNQ, and TCNQ derivatives when complexed with copper or silver as previously described.

Various modifications, adaptations and alterations to the present invention are of course possible in light of the above teachings. It should therefore be understood at this time that within the scope of the appended claims, the invention may be practiced otherwise than was specifically described hereinabove. For example, a plurality of films can be grown onto a single or common substrate. Matrixes of threshold or memory switches or both may be included on such a substrate by proper selection of films.

What is claimed is:

1. A field induced switching apparatus comprising:
a solid-state organic semiconductor, said organic semiconductor comprising a metal complexed with an organic electron acceptor selected from the group consisting of TCNQ, TCNQ derivatives, TCNE, TNAP and DDQ. forming a metal charge-transfer salt;
an electric field applied to the surface of said organic semiconductor, said field being sufficient to induce a solid state reversible electrochemical reaction in said organic semiconductor, causing at least a portion of said organic electron acceptor to switch from a first oxidation state to a second oxidation state.

2. The apparatus of claim 1, wherein said organic electron acceptor in said first oxidation state has at least one detectably different property from said organic electron acceptor in said second oxidation state.

3. The apparatus of claim 2, wherein said first oxidation state has an electrical impedance detectably different from said second oxidation state.

4. The apparatus of claim 2, wherein said organic electron acceptor is chosen from a class of weak electron acceptors having a low reduction potential thereby providing threshold switching from said first oxidation state to said second oxidation state.

5. The apparatus of claim 2, wherein said organic electron acceptor is chosen from a class of strong electron acceptors having a high reduction potential thereby providing memory switching from said first oxidation state to said second oxidation state.

6. The apparatus of claim 2, wherein said metal is selected from the group consisting of silver and copper.

7. The apparatus of claim 2, wherein said organic electron acceptor is TCNQ.

8. The apparatus of claim 2, wherein said organic electron acceptor is TNAP.

9. The apparatus of claim 2, wherein said organic electron acceptor is a TCNQ derivative.

10. The apparatus of claim 2, wherein said organic electron acceptor is TCNQ(OMe).

11. The apparatus of claim 2, wherein said organic electron acceptor is TCNQ(OMe)$_2$.

12. The apparatus of claim 2, wherein said organic electron acceptor is TCNQ(OMe)(OEt).

13. The apparatus of claim 2, wherein said organic electron acceptor is TCNQ(OMe)(O-i-Pr).

14. The apparatus of claim 2, wherein said organic electron acceptor is TCNQ(OMe)(O-i-Bu).

15. The apparatus of claim 2, wherein said organic electron acceptor is TCNQ(OMe)(O-i-C$_2$H$_5$).

16. The apparatus of claim 2, wherein said organic electron acceptor is TCNQ(OEt)(SMe).

17. The apparatus of claim 2, wherein said organic electron acceptor is TCNQCl.

18. The apparatus of claim 2, wherein said organic electron acceptor is TCNQBr.

19. The apparatus of claim 2, wherein said organic electron acceptor is TCNQClMe.

20. The apparatus of claim 2, wherein said organic electron acceptor is TCNQBrMe.

21. The apparatus of claim 2, wherein said organic electron acceptor is TCNQIMe.

22. The apparatus of claim 2, wherein said organic electron acceptor is TCNQI.

23. The apparatus of claim 2, wherein said organic electron acceptor is TCNQ(OMe)(OCH$_3$)$_2$.

24. The apparatus of claim 2, wherein said organic electron acceptor is TCNQ(CN)$_2$.

25. The apparatus of claim 2, wherein said organic electron acceptor is TCNQ(Me).

26. The apparatus of claim 2, wherein said organic electron acceptor is TCNQ(Et).

27. The apparatus of claim 2, wherein said organic electron acceptor is TCNQ(i-Pr).

28. The apparatus of claim 2, wherein said organic electron acceptor is TCNQ(i-Pr)$_2$.

29. The apparatus of claim 2, wherein said organic electron acceptor is TCNE.

30. The apparatus of claim 2, wherein said organic electron acceptor is DDQ.

* * * * *